(12) United States Patent
Akkaya

(10) Patent No.: US 11,454,843 B2
(45) Date of Patent: Sep. 27, 2022

(54) POLARIZATION CONVERSION USING POLARIZATION VOLUME GRATING

(71) Applicant: Microsoft Technology Licensing, LLC, Redmond, WA (US)

(72) Inventor: Onur Can Akkaya, Palo Alto, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 64 days.

(21) Appl. No.: 17/070,633

(22) Filed: Oct. 14, 2020

(65) Prior Publication Data

US 2022/0011610 A1 Jan. 13, 2022

Related U.S. Application Data

(60) Provisional application No. 63/050,621, filed on Jul. 10, 2020.

(51) Int. Cl.
*G09G 3/36* (2006.01)
*G02F 1/13357* (2006.01)
(Continued)

(52) U.S. Cl.
CPC .............. *G02F 1/1336* (2013.01); *G02B 5/18* (2013.01); *G02B 5/3025* (2013.01);
(Continued)

(58) Field of Classification Search
CPC ... G02F 1/1336; G02F 1/133541; G02B 5/18; G02B 5/3025; G02B 27/0172; H01S 5/18386; G09G 3/36; G09G 3/34
See application file for complete search history.

(56) References Cited

U.S. PATENT DOCUMENTS 6,375,327 B2  4/2002 Holman et al.
6,621,533 B2  9/2003 Slack et al.
(Continued)

FOREIGN PATENT DOCUMENTS

| EP | 1886171 A2 | 2/2008 |
|---|---|---|
| EP | 2936220 A1 | 10/2015 |
| WO | 2020112527 A1 | 6/2020 |

OTHER PUBLICATIONS

"International Search Report and Written Opinion Issued in PCT Application No. PCT/US2021/029038", dated Jul. 22, 2021, 12 Pages.

(Continued)

*Primary Examiner* — Pegeman Karimi
(74) *Attorney, Agent, or Firm* — Alleman Hall Creasman & Tuttle LLP

(57) ABSTRACT

One example provides an optical device, comprising a light source configured to output unpolarized light, a polarizing beam splitter configured to split the unpolarized light into light of a first polarization state and light of a second polarization state and a polarization volume grating configured to receive the light of the first polarization state and the light of the second polarization state, and transmit the light of the first polarization state without changing the light of the first polarization state to a different polarization state, and convert the light of the second polarization state to the first polarization state, thereby forming polarized output light.

20 Claims, 5 Drawing Sheets

(51) Int. Cl.
  *G02B 5/18*    (2006.01)
  *G02B 5/30*    (2006.01)
  *H01S 5/183*   (2006.01)
  *G02B 27/01*   (2006.01)
  *G02F 1/1335*  (2006.01)

(52) U.S. Cl.
  CPC ...... *H01S 5/18386* (2013.01); *G02B 27/0172* (2013.01); *G02F 1/133541* (2021.01)

(56) References Cited

U.S. PATENT DOCUMENTS

| | | |
|---|---|---|
| 8,259,239 B2 | 9/2012 | Hua |
| 8,982,313 B2 | 3/2015 | Escuti et al. |
| 9,335,586 B2 | 5/2016 | Escuti et al. |
| 9,671,540 B2 | 6/2017 | Ichihashi |
| 10,095,045 B2 | 10/2018 | Robbins et al. |
| 10,969,599 B1 | 4/2021 | Mceldowney et al. |
| 2014/0285878 A1* | 9/2014 | Escuti ............ G02F 1/13363 156/60 |
| 2020/0033693 A1* | 1/2020 | Lu ............ G02B 27/0093 |
| 2021/0048674 A1* | 2/2021 | Yan ............ G02B 6/005 |
| 2021/0263318 A1* | 8/2021 | Lee ............ G02B 27/0093 |
| 2022/0026720 A1* | 1/2022 | Jamali ............ G02B 27/0093 |

OTHER PUBLICATIONS

Seo, et al., "39.2: Polarization Conversion System Using a Polymer Polarization Grating", In Journal of SID Symposium Digest of Technical Papers, vol. 42, Issue 1, Jun. 1, 2011, pp. 540-543.

Ye, et al., "Circular Polarizer Realized by a Single layer of Planar Chiral Metallic Nanostructure", In Repository of arXiv:1410.2656v1, Oct. 10, 2014, 13 pages.

Yin, et al., "Polarization Volume Gratings for Near-Eye Displays and Novel Photonic Devices", In Journal of Crystals, vol. 10, Issue 7, Jul. 1, 2020, 18 Pages.

* cited by examiner

POLARIZATION CONVERSION USING POLARIZATION VOLUME GRATING

CROSS REFERENCE TO RELATED APPLICATIONS

This application claims priority to U.S. Provisional Patent Application Ser. No. 63/050,621, filed Jul. 10, 2020, the entirety of which is hereby incorporated herein by reference for all purposes.

BACKGROUND

Many optical systems use polarization of light as a property with which to direct and/or modulate light within the optical system. For example, many display devices use liquid crystal display (LCD) panels to spatially modulate the angle and/or phase of polarized light to display images. Likewise, optical systems also may use polarization-sensitive components to direct light within the system, e.g. via the use of polarizing beam splitters and liquid crystal elements, among other optical components.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

One example provides an optical device comprising a light source configured to output unpolarized light, a polarizing beam splitter configured to split the unpolarized light into light of a first polarization state and light of a second polarization state, and a polarization volume grating configured to receive the light of the first polarization state and the light of the second polarization state, transmit the light of the first polarization state without changing the light of the first polarization state to a different polarization state, and convert the light of the second polarization state to the first polarization state, thereby forming polarized output light.

DETAILED DESCRIPTION

Figure 1:
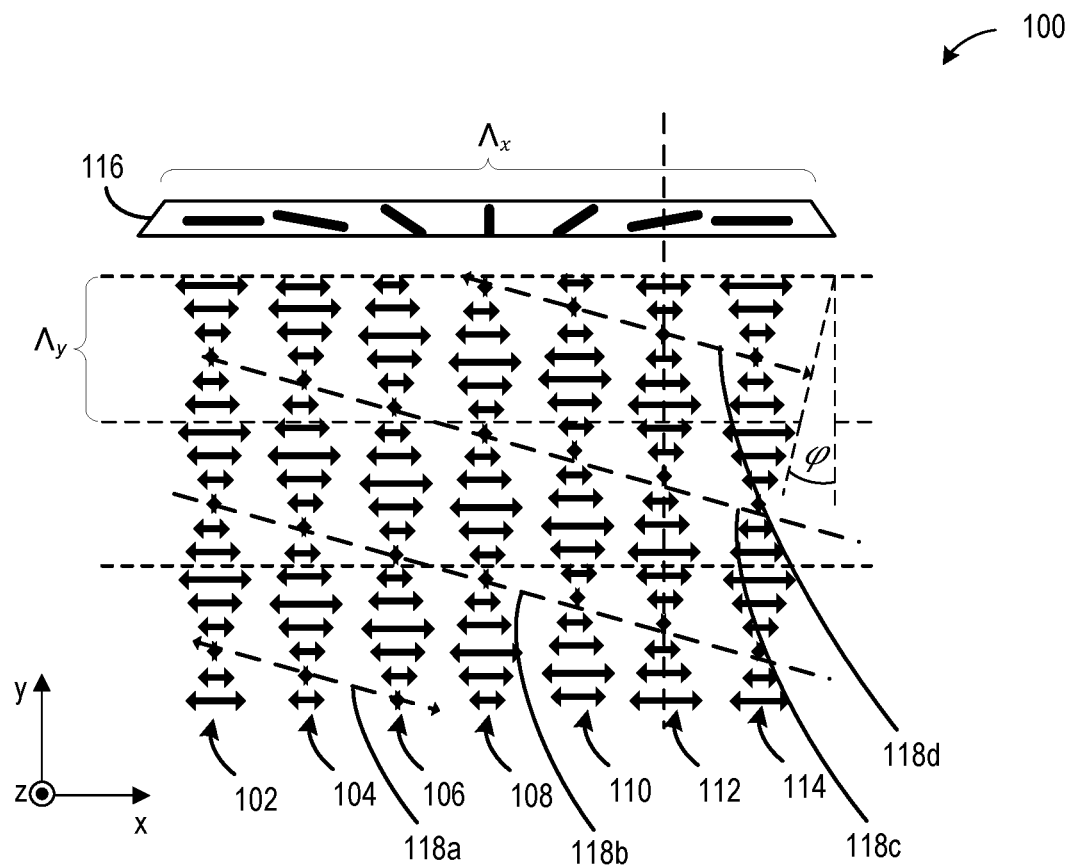
FIG. 1 schematically illustrates a polarization volume grating.

As mentioned above, many optical systems employ polarization as a property for directing and/or modulating light within the optical system. For example, many display devices use liquid crystal display (LCD) panels to spatially modulate the amplitude and/or phase of polarized light to display images. Likewise, optical systems may use polarization-sensitive components to direct light within a system, and/or to direct light exiting the system, e.g. via the use of such elements as polarizing beam splitters and liquid crystal or other birefringent beam steering elements.

Some such optical devices may use light sources that emit unpolarized light. Examples of such light sources include vertical-cavity surface-emitting lasers (VCSELs) and light emitting diodes. In such devices, various types of polarizers may be used to form polarized light from the unpolarized light produced by the light source. Examples include absorptive polarizers, such as polarizing filters used in liquid crystal displays (LCDs), and beam-splitting polarizers.

The use of a polarizer to form polarized light from unpolarized light results in the loss of over one half of the intensity from the light source. To compensate for this loss of intensity, the light source may be operated at a relatively higher power to increase the brightness of light output by an optical device. However, operating a light source at a relatively higher intensity also increases power usage compared to operating the light source at lower intensity. For mobile battery-powered devices, this may impact how long a device can operate before battery recharging.

To avoid such loss of intensity, an optical system may utilize a polarizing beam splitter to split unpolarized light into two oppositely polarized components, rotate the polarization of one component (e.g. with a half-wave plate or other suitable component(s)), and then recombine the light. However, such an arrangement may utilize more space than is available on smaller mobile devices.

Accordingly, examples are disclosed that relate to thin-film polarization converters that can convert unpolarized light into polarized light in a relatively small amount of space with little loss of intensity. Briefly, the disclosed examples utilize a polarizing beam splitter in combination with a polarization volume grating to form polarized light. These components may be implemented as thin films, and thus can be arranged in a stack to convert unpolarized light into polarized light within a small volume of space. In some examples, an additional polarization grating may be used to redirect polarized light output by the polarization volume grating. Where used, this additional polarization grating also may be implemented as a thin film. The disclosed examples may be used in any optical system that converts unpolarized light to polarized light, and may be particularly useful in battery-powered devices, where lower power operation can help increase operating time between battery charges.

FIG. 1. shows a schematic depiction of a polarization volume grating (PVG) 100 utilizing liquid crystals. An example PVG is described in more detail in Y. Weng, D. Xu, Y. Zhang, X. Li, and S. Wu, "Polarization volume grating with high efficiency and large diffraction angle," Opt. Express 24, 17746-17759 (2016). In the depicted PVG 100, a top substrate 116 is configured to vary a rotational position in the xz plane of the optical axes of liquid crystal molecules (illustrated schematically by helical arrays 102, 104, 106, 108, 110, 112, 114 of arrows) with a period of $\Lambda_x$. Further, the liquid crystal molecules exhibit a helical structure with a period of $\Lambda_y$ along the y axis. This structure generates a series of slanted and periodical refractive index planes 118a, 118b, 118c, and 118d with a slant angle $\varphi=\pm\arctan(\Lambda_y/\Lambda_x)$, where $\Lambda_x$ and $\Lambda_y$ are the period lengths in x and y, respectively.

Figure 2:
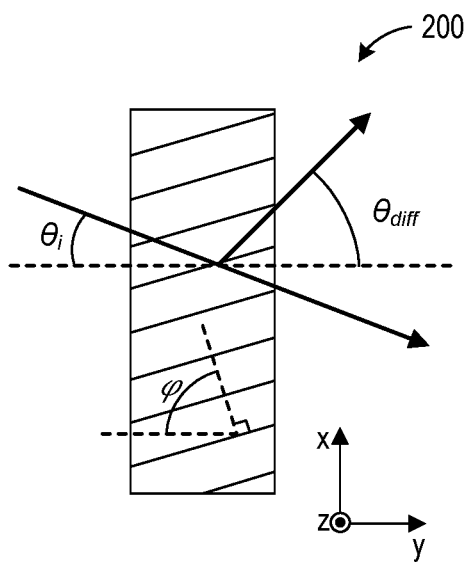
FIG. 2 schematically illustrates light passing through a transmissive polarization volume grating.

Depending on the slant angle φ, PVGs may operate in either reflection or transmission. FIG. 2 shows an example transmissive PVG 200. The relationship between slant angle φ and the first-order diffraction angle $\theta_{diff}$ when incident angle $\theta_i=0°$ is given by the following for reflective and transmissive PVGs.

$$\theta = \begin{cases} 2\varphi & 0 \le \varphi < \frac{\pi}{4} \to \text{Reflective grating} \\ \pi - 2\varphi & \frac{\pi}{4} < \varphi < \frac{\pi}{2} \to \text{Transmissive grating} \end{cases}$$

A PVG diffracts circularly polarized light having the same handedness as the helical twist. For a transmissive PVG, polarization of the diffracted beam is converted to the orthogonal direction. More specifically, light having right-handed circular polarization (RCP) is converted to light having left-handed circular polarization (LCP), or vice versa. When the incident beam has the opposite handedness as the helix twist of the PVG, the incident beam traverses the PVG as zeroth order without any change to its polarization or direction.

Figure 3:
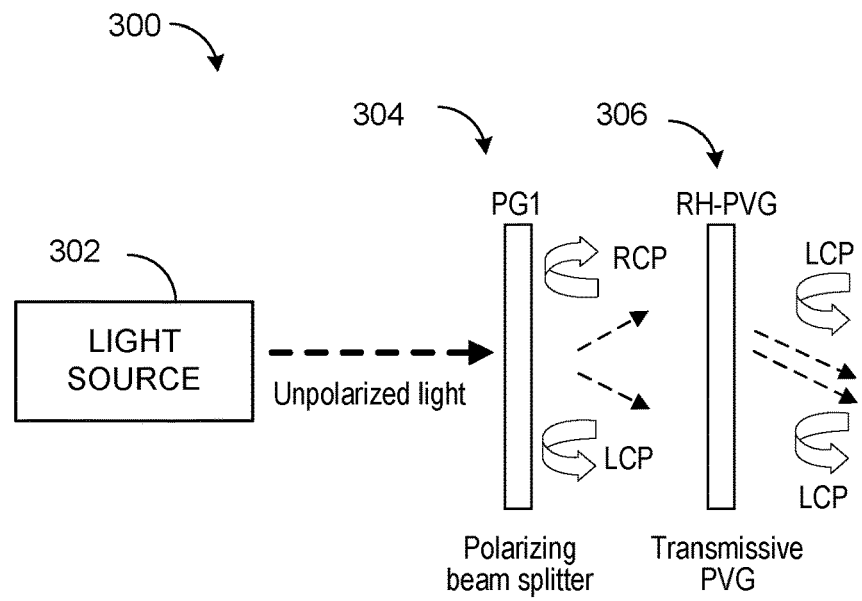
FIG. 3 schematically illustrates a polarization converter comprising a polarization grating and a transmissive polarization volume grating.

As such, a PVGs operating in transmissive mode, in combination with a polarizing beam splitter upstream of the PVG, can be used as a polarization converter to convert unpolarized light to polarized light. FIG. 3 schematically illustrates an example polarization converter 300 comprising a polarizing beam splitter 304 and a PVG 306. Unpolarized light from a light source 302 is directed onto the polarizing beam splitter 304 (PG1). The polarizing beam splitter 304 splits the light into a right-hand circularly polarized (RCP) component and a left-hand circularly polarized (LCP) component. The splitting of the unpolarized light into two orthogonally-polarized components may be accomplished with little loss of intensity. Next, the RCP and LCP light components pass through a PVG 306, here illustrated as a right-hand PVG, which converts the incident RCP light to LCP while transmitting the incident LCP light without altering its polarization. The conversion of RCP light to LCP light also results in little loss of intensity. The resulting polarized output light may have an intensity of within 95% or more of the original unpolarized light, and may be provided to other polarization-sensitive optical components. For example, where polarization converter 300 is incorporated into a display device (whether a display panel or a display projector), the resulting polarized output light may be provided to a LCD panel or other polarization-sensitive spatial light modulator for image production. Likewise, where polarization converter 300 is incorporated into a projector for a depth sensor, the resulting polarized output light may be provided to a polarization-sensitive beam steerer to direct the light to selected areas of an environment being imaged. While the depicted example uses a right-hand PVG, it will be understood that a left-hand PVG could also be used, which would result in the production of RCP output light.

In the example of FIG. 3, the output light exits the PVG 306 at an angle from an optical axis of the system (as shown by the arrow between the light source and PG1) based upon the periods of the PVG and polarizing beam splitter gratings. PG1 and PVG may be configured to output light at any suitable angles. In some examples, the polarized output light may be emitted at angles relatively closer to an optical axis, which may facilitate the design of anti-reflection coatings (ARCs), help to reduce stray light, and reduce aperture size compared to polarization converters in which polarized output light is emitted at higher angles relative to the optical axis.

Figure 4:
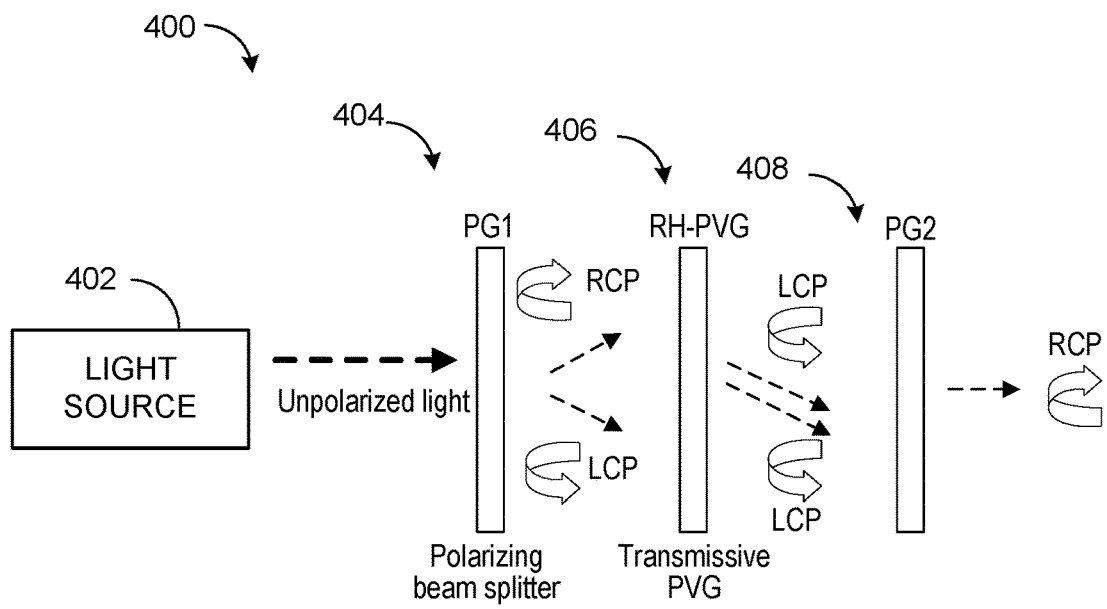
FIG. 4 schematically illustrates a polarization converter comprising a first polarization grating, a transmissive polarization volume grating, and a second polarization grating.

In other examples, an additional polarization grating may be used to redirect the polarized light from the PVG at a desired angle, whether along the optical axis or in any other suitable direction. FIG. 4 schematically shows an example polarization converter 400 comprising a second polarization grating (PG2) 408 optically downstream of a light source 402, a first polarization grating (PG1) 404 used as the polarizing beam splitter, and a PVG 406. As depicted in FIG. 4, the use of PG2 408 rotates the polarization of the incident light, such that light output by PG2 408 has an orthogonal polarization state compared to the light incident on PG2 408.

The polarization gratings and PVGs described above may be implemented as thin films. In some examples, PG1, PVG, and optional PG2 each may be implemented on its own substrate, wherein each substrate may have a thickness on the order of tens of microns. As such, the overall thickness of a polarization converter film stack comprising PG1, PVG, and PG2 may be in a range of tens of microns. Further, in some examples, PVG and one of PG1 or PG2 may be formed on a same substrate, which may help to reduce the film thickness.

The disclosed example polarization converters may offer the advantage of not having a limited aperture. As such, the disclosed polarization converters may be as wide as a light source or light source array. The disclosed example polarization converters may be used in a variety of different devices, including but not limited to augmented reality and mixed reality head-mounted display systems (which may utilize liquid crystal on silicon or micro-LCD displays), mobile phones, and other portable devices, as well as televisions, monitors, and other larger format devices. In some examples, a polarization converter comprising a film stack may be placed directly over an unpolarized light source (e.g. in contact with a light source). In other examples, a polarization converter comprising a film stack may be placed at any other suitable location within an optical system, such as on a surface of another optical component.

Figure 5:
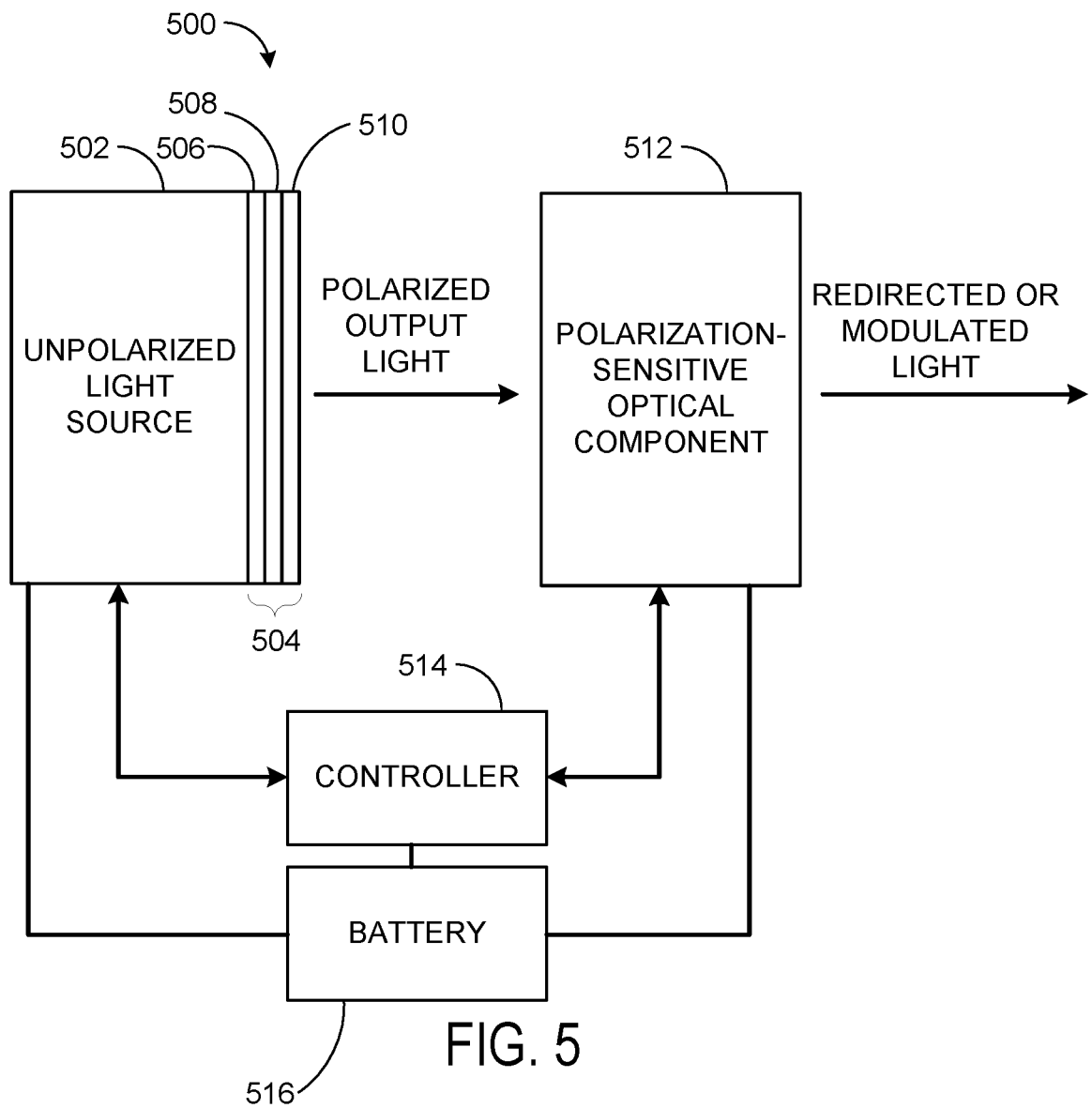
FIG. 5 schematically illustrates an optical device comprising an unpolarized light source and an example polarization converter.

FIG. 5 shows a schematic depiction of an optical device 500 comprising an unpolarized light source 502, a thin-film polarization converter 504 positioned over the light source, and a polarization-sensitive optical component 512 that receives light from the polarization converter 504. The thin-film polarization converter 504 comprises a first PG 506, a PVG 508, and a second PG 510. In other examples, second PG 510 may be omitted. In some examples, various optical components may be located between the polarization-sensitive optical component 512 and the polarization converter 504, while in other examples the polarization-sensitive optical component 512 receives the polarized output light directly from the polarization converter 504 (i.e. where the light source and polarization converter are combined in an integrated backlight unit for a display). The polarization-sensitive optical component 512 may represent any suitable optical component in an optical system. For example, the polarization-sensitive optical component 512 may be a liquid crystal panel configured to modulate the polarization angle and/or phase of light, or a birefringent beam-steering device (e.g. a liquid crystal beam steering device). Polarization converters 300 and 400 are non-limiting examples of suitable structures for use as polarization converter 504. Optical device 500 further comprises a controller 514 in communication with the polarization-sensitive optical component 512 and the unpolarized light source 502. The controller 514 may be used to form a display image (e.g. where component 512 is a display panel) or to steer the projection of light into an environment (e.g. where component 512 is a beam steerer). Optical device 500 further comprises an optional battery 516, such as in examples where the optical device 500 represents a mobile device comprising a polarization-based display (e.g. an LCD or LCOS display) and/or a depth sensor utilizing a birefringent beam steerer. As mentioned above, the use of polarization converter 504 may help to preserve the brightness of light output by the light source compared to conventional polarizers, and thus may allow for lower power operation, which may help lengthen an amount of time device 500 can be used between battery recharging.

Figure 6:
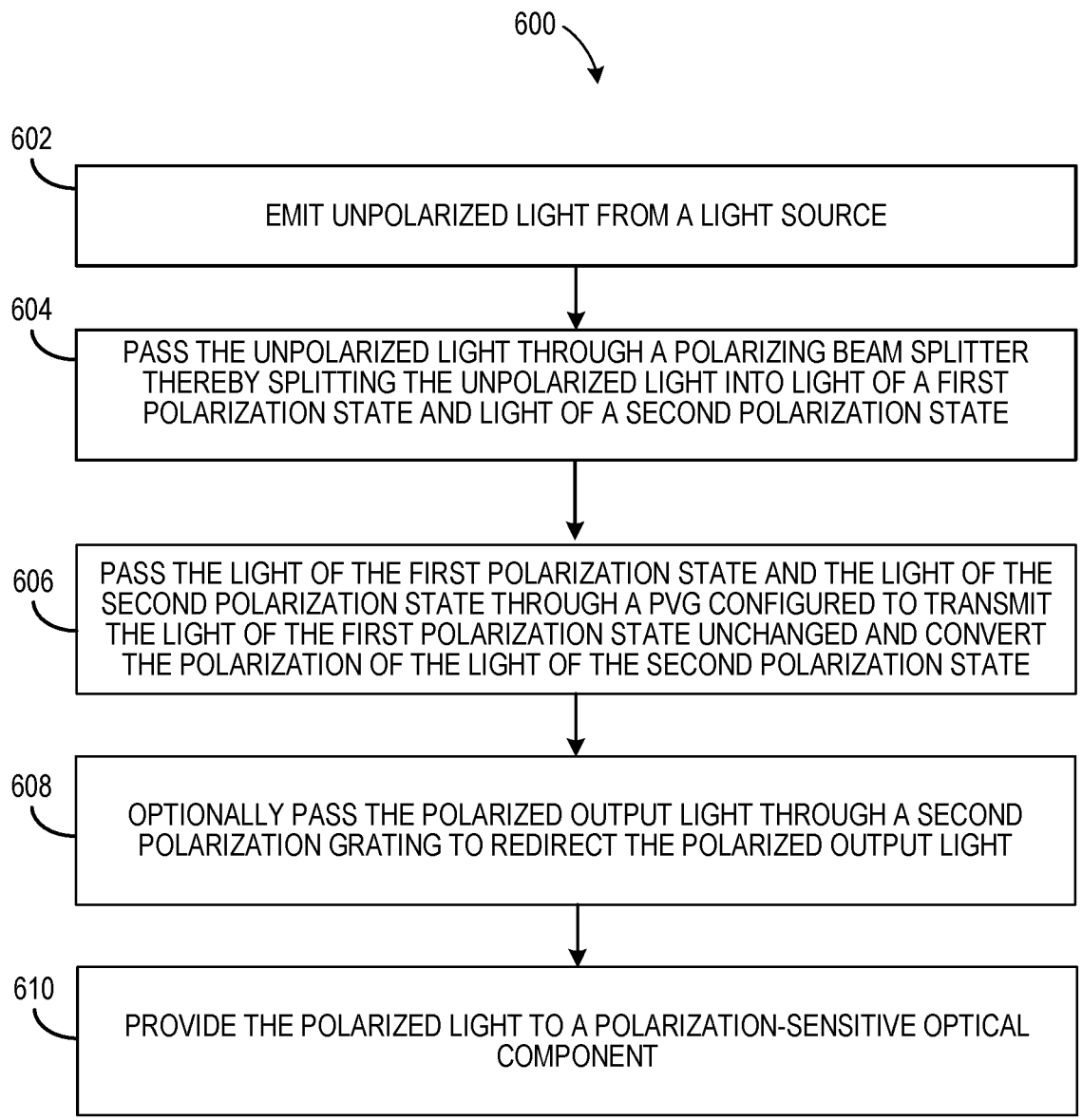
FIG. 6 shows a flow diagram depicting an example method for operating an optical device.

FIG. 6 shows a flow diagram depicting an example method 600 for operating an optical device. Example optical devices include, but are not limited to, display devices and depth sensors comprising projectors. Method 600 includes, at 602, emitting unpolarized light from a light source. Any suitable unpolarized light source can be used, including but not limited to VCSEL arrays and LEDs. Method 600 further comprises, at 604, passing the unpolarized light through a polarizing beam splitter, thereby splitting the unpolarized light into light of a first polarization state and light of a second polarization state, wherein the light of the first polarization state is one of right-hand circularly polarized light and left-hand circularly polarized light, and wherein the second polarization state is the other of right-hand circularly polarized light and left-hand circularly polarized light.

Method 600 further comprises, at 606, passing the light of the first polarization state and the light of the second polarization state through a PVG configured to transmit the light of the first polarization state without changing the light of the first polarization state to a different polarization state while converting the light of the second polarization state to the first polarization state, thereby forming polarized output light. The PVG may be a right-hand PVG or a left-hand PVG in various examples. Further, in some examples, the polarizing beam splitter and the polarization volume grating comprise layers in a stack of films.

In some examples, a second polarization grating may be used optically downstream of the PVG. As such, method 600 includes, at 608, passing the polarized output light through a second polarization grating optically downstream of the polarization volume grating to redirect the polarized output light. After forming the polarized output light from the unpolarized light, method 600 comprises, at 610, providing the polarized output light to a polarization sensitive optical component. In various examples, the polarization sensitive optical component may comprise a liquid crystal display panel, a birefringent beam-steerer, or any other suitable polarization-sensitive component.

In some embodiments, the methods and processes described herein may be tied to a computing system of one or more computing devices. In particular, such methods and processes may be implemented as a computer-application program or service, an application-programming interface (API), a library, and/or other computer-program product.

Figure 7:
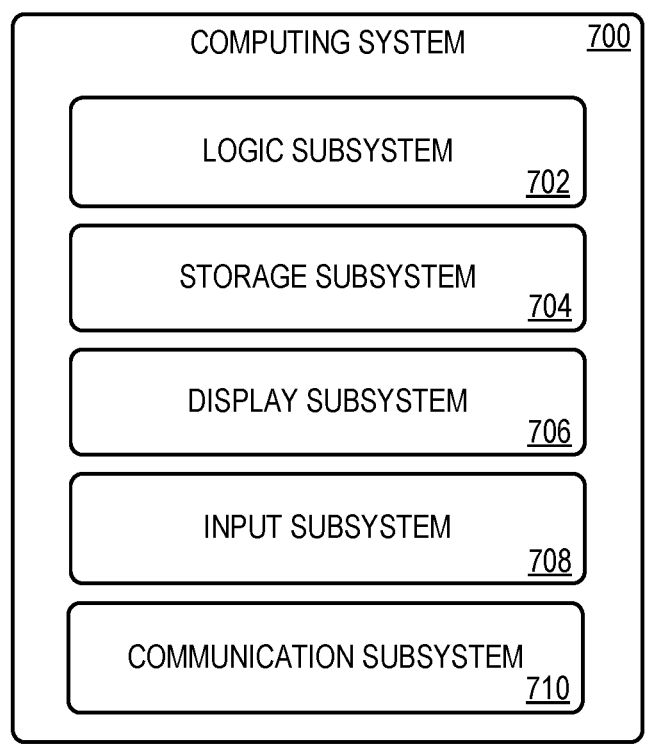
FIG. 7 shows a block diagram of an example computing device.

FIG. 7 schematically shows a non-limiting embodiment of a computing system 700 that can enact one or more of the methods and processes described above. Computing system 700 is shown in simplified form. Computing system 700 may take the form of one or more personal computers, server computers, tablet computers, home-entertainment computers, network computing devices, gaming devices, mobile computing devices, mobile communication devices (e.g., smart phone), and/or other computing devices. Computing system 700 may be representative of controller 514, as an example.

Computing system 700 includes a logic subsystem 702 and a storage subsystem 704. Computing system 700 may optionally include a display subsystem 706, input subsystem 708, communication subsystem 710, and/or other components not shown in FIG. 7.

Logic subsystem 702 includes one or more physical devices configured to execute instructions. For example, logic subsystem 702 may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

Logic subsystem 702 may include one or more processors configured to execute software instructions. Additionally, or alternatively, logic subsystem 702 may include one or more hardware or firmware logic machines configured to execute hardware or firmware instructions. Processors of logic subsystem 702 may be single-core or multi-core, and the instructions executed thereon may be configured for sequential, parallel, and/or distributed processing. Individual components of logic subsystem 702 optionally may be distributed among two or more separate devices, which may be remotely located and/or configured for coordinated processing. Aspects of logic subsystem 702 may be virtualized and executed by remotely accessible, networked computing devices configured in a cloud-computing configuration.

Storage subsystem 704 includes one or more physical devices configured to hold instructions executable by the logic machine to implement the methods and processes described herein. When such methods and processes are implemented, the state of storage subsystem 704 may be transformed—e.g., to hold different data.

Storage subsystem 704 may include removable and/or built-in devices. Storage subsystem 704 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage subsystem 704 may include volatile, nonvolatile, dynamic, static, read/write, read-only, random-access, sequential-access, location-addressable, file-addressable, and/or content-addressable devices.

It will be appreciated that storage subsystem 704 includes one or more physical devices. However, aspects of the instructions described herein alternatively may be propagated by a communication medium (e.g., an electromagnetic signal, an optical signal, etc.) that is not held by a physical device for a finite duration.

Aspects of logic subsystem 702 and storage subsystem 704 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 706 may be used to present a visual representation of data held by storage subsystem 704. This visual representation may take the form of a graphical user interface (GUI). As the herein described methods and processes change the data held by the storage machine, and thus transform the state of the storage machine, the state of display subsystem 706 may likewise be transformed to visually represent changes in the underlying data. Display subsystem 706 may include one or more display devices utilizing virtually any type of technology. Such display devices may be combined with logic subsystem 702 and/or storage subsystem 704 in a shared enclosure, or such display devices may be peripheral display devices.

When included, input subsystem 708 may comprise or interface with one or more user-input devices such as a keyboard, mouse, touch screen, or game controller. In some embodiments, input subsystem 708 may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 710 may be configured to communicatively couple computing system 700 with one or more other computing devices. Communication subsystem 710 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 700 to send and/or receive messages to and/or from other devices via a network such as the Internet.

Another example provides an optical device, comprising a light source configured to output unpolarized light, a polarizing beam splitter configured to split the unpolarized light into light of a first polarization state and light of a second polarization state, and a polarization volume grating configured to receive the light of the first polarization state and the light of the second polarization state, and transmit the light of the first polarization state without changing the light of the first polarization state to a different polarization state, and convert the light of the second polarization state to the first polarization state, thereby forming polarized output light. The light of the first polarization state may additionally or alternatively be one of right-hand circularly polarized light and left-hand circularly polarized light, and the second polarization state may additionally or alternatively be the other of right-hand circularly polarized light and left-hand circularly polarized light. The polarizing beam splitter and the polarization volume grating may additionally or alternatively include layers in a stack of films. Where the polarizing beam splitter is a first polarization grating, the optical device may additionally or alternatively include a second polarization grating optically downstream of the polarization volume grating to redirect the polarized output light. Where the optical device is a display device, the optical device may additionally or alternatively include a liquid crystal display panel. The optical device may additionally or alternatively include a projector. The optical device may additionally or alternatively include a battery. The light source may additionally or alternatively include one or more of a vertical-cavity surface-emitting laser and a light-emitting diode.

Another example provides, enacted on an optical device, a method comprising emitting unpolarized light from a light source, passing the unpolarized light through a polarizing beam splitter, thereby splitting the unpolarized light into light of a first polarization state and light of a second polarization state, and passing the light of the first polarization state and the light of the second polarization state through a polarization volume grating configured to transmit the light of the first polarization state without changing the light of the first polarization state to a different polarization state, and convert the light of the second polarization state to the first polarization state, thereby forming polarized output light. The light of the first polarization state may additionally or alternatively be one of right-hand circularly polarized light and left-hand circularly polarized light, and the second polarization state may additionally or alternatively be the other of right-hand circularly polarized light and left-hand circularly polarized light. The polarizing beam splitter and the polarization volume grating may additionally or alternatively include layers in a stack of films. Where the polarizing beam splitter is a first polarization grating, the method may additionally or alternatively include passing the polarized output light through a second polarization grating optically downstream of the polarization volume grating to redirect the polarized output light. The method may additionally or alternatively include using the polarized output light to form an image via a liquid crystal display panel. The method may additionally or alternatively include using the polarized output light in a projector. Emitting unpolarized light may additionally or alternatively include one or more of emitting the unpolarized light via a vertical-cavity surface-emitting laser and emitting the unpolarized light via a light-emitting diode.

Another example provides an optical device, comprising a light source configured to output unpolarized light, a first polarization grating comprising a polarizing beam splitter configured to split the unpolarized light into light of a polarization state and light of a second polarization state, a polarization volume grating configured to receive the light of the polarization state and the light of the second polarization state, and transmit the light of the polarization state without changing the light of the polarization state to a different polarization state, and convert the light of the second polarization state to the polarization state, thereby forming polarized output light, and a second polarization grating optically downstream of the polarization volume grating to redirect the polarized output light. The light of the first polarization state may additionally or alternatively be one of right-hand circularly polarized light and left-hand circularly polarized light, and the second polarization state may additionally or alternatively be the other of right-hand circularly polarized light and left-hand circularly polarized light. The polarizing beam splitter and the polarization volume grating may additionally or alternatively include layers in a stack of films. Where the optical device is a display device, the optical device may additionally or alternatively include a liquid crystal display panel. The light source may additionally or alternatively include one or more of a vertical-cavity surface-emitting laser and a light-emitting diode.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An optical device, comprising:
a light source configured to output unpolarized light;
a polarizing beam splitter configured to split the unpolarized light into light of a first polarization state and light of a second polarization state; and
a polarization volume grating configured to
receive the light of the first polarization state and the light of the second polarization state,
transmit the light of the first polarization state without changing the light of the first polarization state to a different polarization state and without changing a direction of the light of the first polarization state by diffraction, and convert the light of the second polarization state to the first polarization state and change the direction of the light of the second polarization state by diffraction, thereby forming polarized output light.

2. The optical device of claim 1, wherein the light of the first polarization state is one of right-hand circularly polarized light and left-hand circularly polarized light, and wherein the second polarization state is the other of right-hand circularly polarized light and left-hand circularly polarized light.

3. The optical device of claim 1, wherein the polarizing beam splitter and the polarization volume grating comprise layers in a stack of films.

4. The optical device of claim 1, wherein the polarizing beam splitter is a first polarization grating, and further comprising a second polarization grating optically downstream of the polarization volume grating to redirect the polarized output light.

5. The optical device of claim 1, wherein the optical device is a display device, and further comprises a liquid crystal display panel.

6. The optical device of claim 1, wherein the optical device is a projector.

7. The optical device of claim 1, further comprising a battery.

8. The optical device of claim 1, wherein the light source comprises one or more of a vertical-cavity surface-emitting laser and a light-emitting diode.

9. Enacted on an optical device, a method comprising:
emitting unpolarized light from a light source;
passing the unpolarized light through a polarizing beam splitter, thereby splitting the unpolarized light into light of a first polarization state and light of a second polarization state; and
passing the light of the first polarization state and the light of the second polarization state through a polarization volume grating configured to transmit the light of the first polarization state without changing the light of the first polarization state to a different polarization state and without changing a direction of the light of the first polarization state by diffraction, and convert the light of the second polarization state to the first polarization state and change the direction of the light of the second polarization state by diffraction, thereby forming polarized output light.

10. The method of claim 9, wherein the light of the first polarization state is one of right-hand circularly polarized light and left-hand circularly polarized light, and wherein the second polarization state is the other of right-hand circularly polarized light and left-hand circularly polarized light.

11. The method of claim 9, wherein the polarizing beam splitter and the polarization volume grating comprise layers in a stack of films.

12. The method of claim 9, wherein the polarizing beam splitter is a first polarization grating, and further comprising passing the polarized output light through a second polarization grating optically downstream of the polarization volume grating to redirect the polarized output light.

13. The method of claim 9, further comprising using the polarized output light to form an image via a liquid crystal display panel.

14. The method of claim 9, further comprising using the polarized output light in a projector.

15. The method of claim 9, wherein emitting unpolarized light comprises one or more of emitting the unpolarized light via a vertical-cavity surface-emitting laser and emitting the unpolarized light via a light-emitting diode.

16. An optical device, comprising:
a light source configured to output unpolarized light;
a first polarization grating comprising a polarizing beam splitter configured to split the unpolarized light into light of a first polarization state and light of a second polarization state;
a polarization volume grating configured to
receive the light of the first polarization state and the light of the second polarization state,
transmit the light of the first polarization state without changing the light of the first polarization state to a different polarization state and without changing a direction of the light of the first polarization state by diffraction, and convert the light of the second polarization state to the first polarization state and change the direction of the light of the second polarization state by diffraction, thereby forming polarized output light; and
a second polarization grating optically downstream of the polarization volume grating to redirect the polarized output light.

17. The optical device of claim 16, wherein the light of the first polarization state is one of right-hand circularly polarized light and left-hand circularly polarized light, and wherein the second polarization state is the other of right-hand circularly polarized light and left-hand circularly polarized light.

18. The optical device of claim 16, wherein the polarizing beam splitter and the polarization volume grating comprise layers in a stack of films.

19. The optical device of claim 16, wherein the optical device is a display device, and further comprises a liquid crystal display panel.

20. The optical device of claim 16, wherein the light source comprises one or more of a vertical-cavity surface-emitting laser and a light-emitting diode.

* * * * *